(12) United States Patent
Hantschel

(10) Patent No.: US 11,955,368 B2
(45) Date of Patent: Apr. 9, 2024

(54) WAFER CONFIGURED TO RECONDITION A SUPPORT SURFACE OF A WAFER HOLDING STAGE

(71) Applicant: IMEC vzw, Leuven (BE)

(72) Inventor: Thomas Hantschel, Houtvenne (BE)

(73) Assignee: IMEC VZW, Leuven (BE)

( * ) Notice: Subject to any disclaimer, the term of this patent is extended or adjusted under 35 U.S.C. 154(b) by 875 days.

(21) Appl. No.: 16/927,707

(22) Filed: Jul. 13, 2020

(65) Prior Publication Data
US 2021/0020494 A1   Jan. 21, 2021

(30) Foreign Application Priority Data
Jul. 15, 2019   (EP) ..................................... 19186234

(51) Int. Cl.
*H01L 21/687* (2006.01)
*H01L 21/02* (2006.01)

(52) U.S. Cl.
CPC .. *H01L 21/68785* (2013.01); *H01L 21/02035* (2013.01); *H01L 21/02527* (2013.01)

(58) Field of Classification Search
CPC ......... H01L 21/68785; H01L 21/02035; H01L 21/02527; H01L 21/6875; B29C 33/3857; B29C 33/424
See application file for complete search history.

(56) References Cited

U.S. PATENT DOCUMENTS

| | | |
|---|---|---|
| 2007/0146679 A1 | 6/2007 | Sutedja et al. |
| 2011/0230127 A1 | 9/2011 | Moldovan et al. |
| 2013/0140838 A1 | 6/2013 | Wang et al. |

(Continued)

FOREIGN PATENT DOCUMENTS

| | | |
|---|---|---|
| JP | 2014-240851 A | 12/2014 |
| NL | 2022445 A | 2/2019 |

OTHER PUBLICATIONS

Akamine et al., "Low temperature thermal oxidation sharpening of microcast tips," Journal of Vacuum Science & Technology B: Microelectronics and Nanometer Structures Processing, Measurement, and Phenomena, vol. 10, 2307-2310, 1992.

(Continued)

*Primary Examiner* — Ermias T Woldegeorgis
(74) *Attorney, Agent, or Firm* — Knobbe, Martens, Olson & Bear, LLP

(57) ABSTRACT

According to one aspect, a reconditioning wafer can include a carrier substrate that supports at least one array of regularly spaced protrusions configured to form indentations in a support surface of a wafer holding stage. The protrusions within the same array can have substantially the same shape and dimensions, thereby enabling a more reliable reconditioning process compared to prior art solutions. The protrusions may have the form of pyramids or pillars or other similar shapes with at least the tip of the protrusions formed of a material suitable to make the indentations. The reconditioning wafer can be obtainable by a molding technique wherein an array of molds can be created in a mold substrate. The molds can be filled with an indentation material such as diamond, and can be bonded to the carrier substrate. The mold substrate can be removed by thinning and wet etching.

24 Claims, 8 Drawing Sheets

(56) References Cited

U.S. PATENT DOCUMENTS

2015/0185249 A1     7/2015   Hantschel et al.
2021/0053177 A1*   2/2021   Scholten ................... B24B 7/22

OTHER PUBLICATIONS

Park et al., "Fabrication of Diamond Tip Cantilever and its Application to Tribo-nanolithography," Proceedings 2005 IEEE International Symposium on Computational Intelligence in Robotics and Automation, Jun. 27-30, 2005, Espoo, Finland, 695-700.
Extended European Search Report dated Jan. 24, 2020 in counterpart European Application No. 19186234.1 in 8 pages.

* cited by examiner

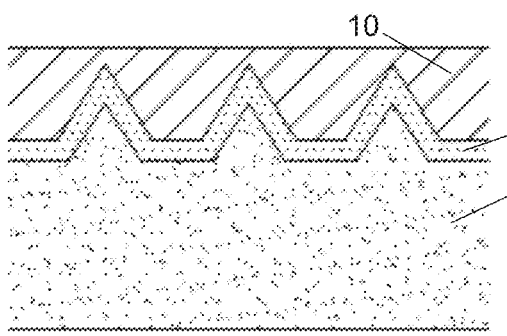
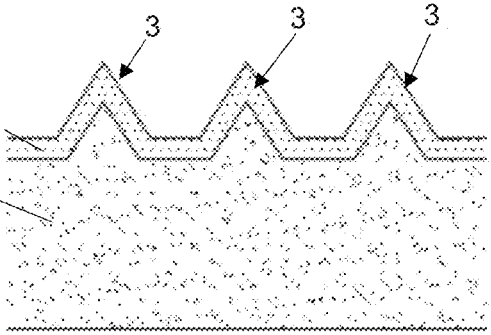
FIG. 2f    FIG. 2g
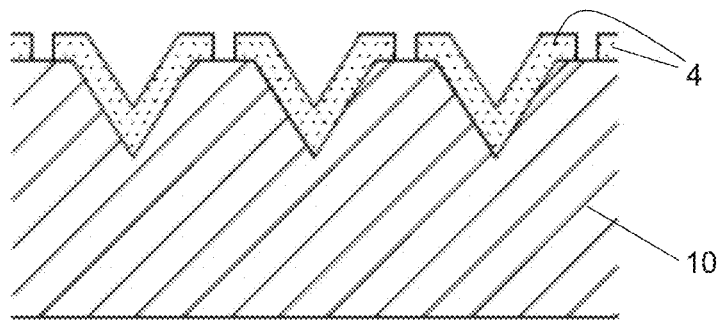
FIG. 3a
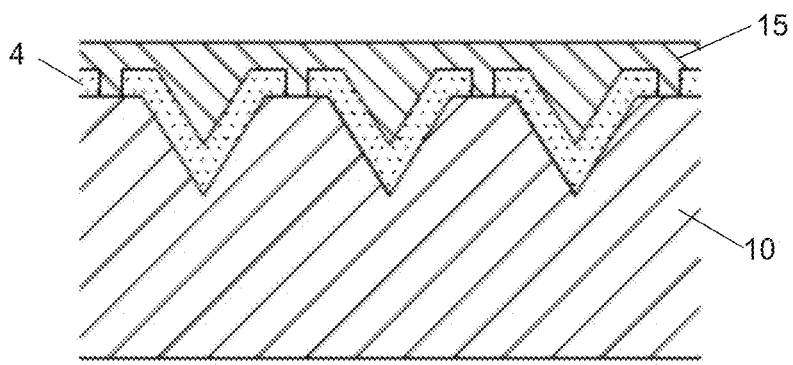
FIG. 3b
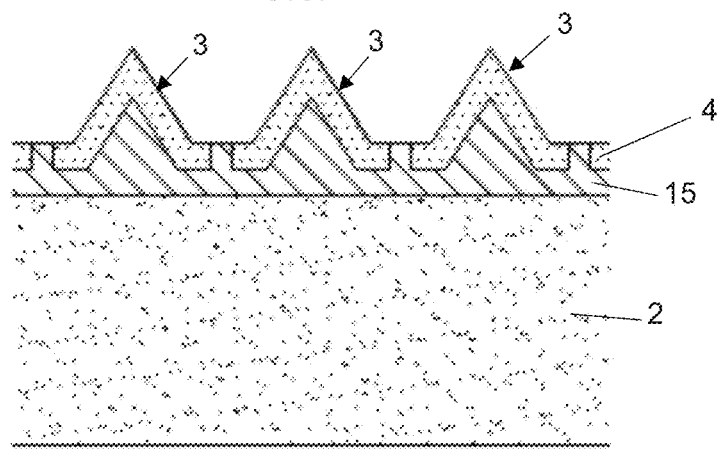
FIG. 3c

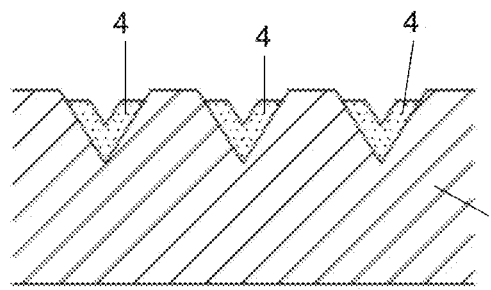
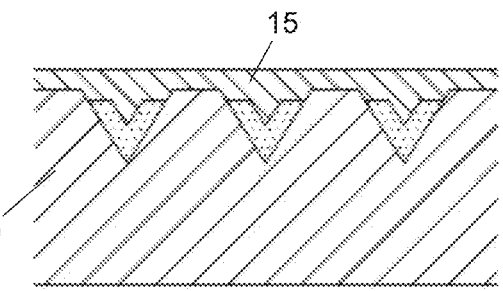
FIG. 4a　　　　　　　　　　FIG. 4b
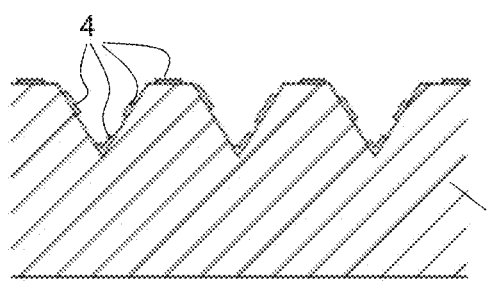
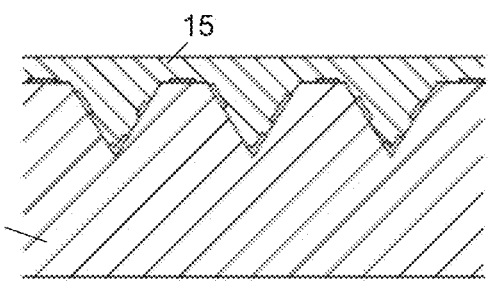
FIG. 5a　　　　　　　　　　FIG. 5b
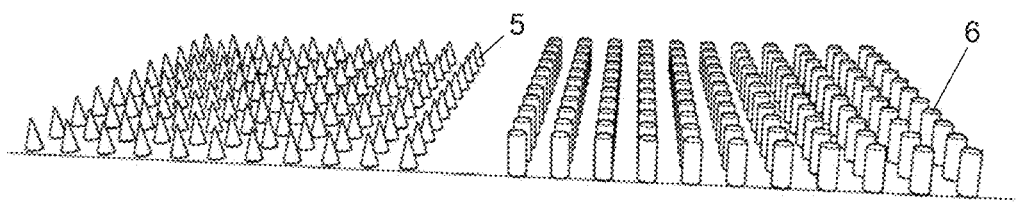
FIG. 6

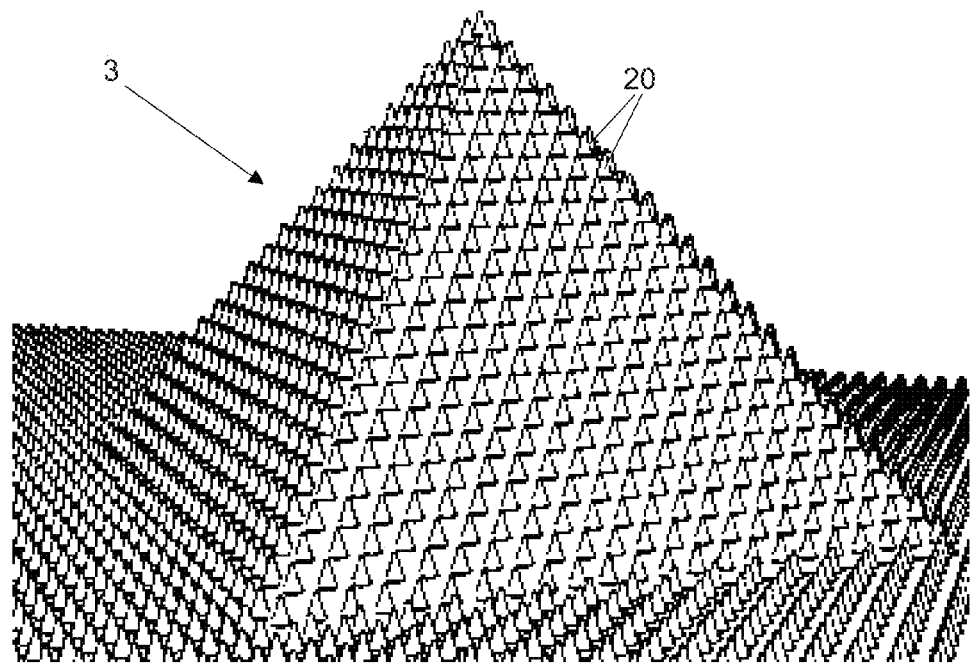
FIG. 10
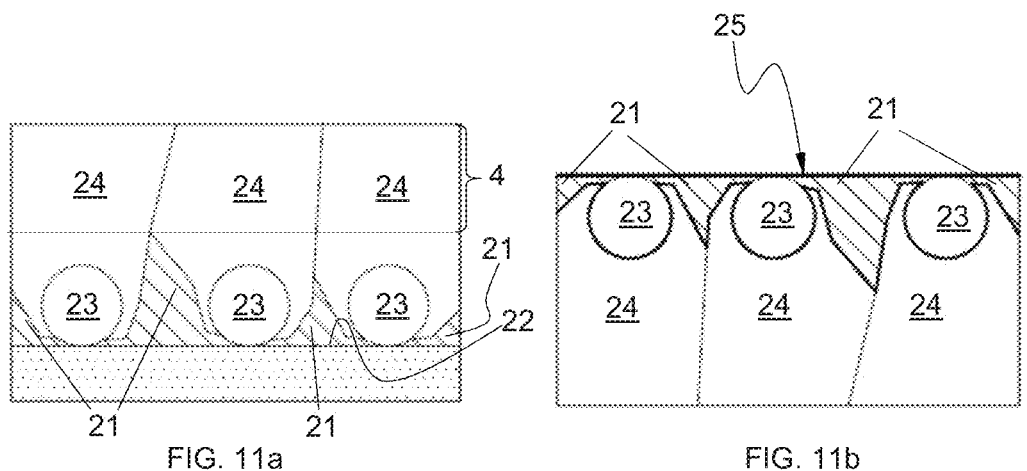
FIG. 11a
FIG. 11b
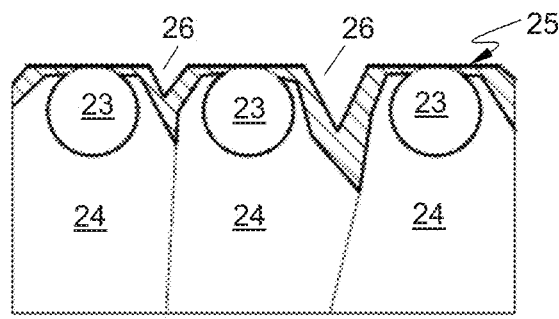
FIG. 11c

WAFER CONFIGURED TO RECONDITION A SUPPORT SURFACE OF A WAFER HOLDING STAGE

CROSS-REFERENCE TO RELATED APPLICATIONS

This application claims foreign priority to European Patent Application No. EP 19186234.1, filed Jul. 15, 2019, the content of which is incorporated by reference herein in its entirety.

BACKGROUND

Field

The disclosed technology is generally related to the reconditioning of a holding stage used to hold semiconductor wafers in a semiconductor manufacturing or treatment tool.

Description of the Related Technology

A semiconductor wafer holding stage is present in various manufacturing and treatment tools used in the semiconductor industry. A holding stage used for example in lithography tools, or so-called steppers, can comprise a wafer table having at least the size of a standard wafer, and can be provided with pillar-shaped protrusions of equal height distributed across the holding surface in a regular array. The pillars may have a diameter in the order of 200 micrometers and can be arranged in a rectangular array with a pitch of about 1.5 mm. Wafers can be supported on the upper surface of the pillars. The pillars can be coated with a diamond-like carbon coating (DLC), functioning as an anti-friction coating. The coating can be rough in the beginning but get smoother over time, which can be unwanted as it can lead to higher stickiness of the processed or treated wafers.

The DLC coating can be reconditioned by creating nano-sized indentations in the upper surface, e.g., the wafer-supporting surface, of the pillars. This can be realized by a reconditioning wafer which may be a silicon wafer provided with a microcrystalline diamond (MCD) coating. The MCD coating can be formed of sharp nano-crystals distributed across the surface of the wafer. With the MCD coating in contact with the carrying surface, a pressure may be exerted on the reconditioning wafer, thereby pushing the sharp nano-crystals into the DLC coating to thereby increase its roughness.

This solution may not be ideal in various instances, due to the irregularity of the height and sharpness of the nano-crystals of the MCD coating, as well as the irregularity of the distance between adjacent nano-sized peaks within the MCD coating. In addition, diamond coated silicon wafers typically can be prone to wafer bowing due to high stress values. Zero-stress and zero-bow can be extremely difficult to achieve, and anti-stress coatings can be used to mitigate the wafer bow to a lower degree.

SUMMARY OF CERTAIN INVENTIVE ASPECTS

The disclosed technology aims to provide a solution to the above-described technical problems. This can be achieved by reconditioning wafers and by methods to produce reconditioning wafers as described herein, e.g., in accordance with the appended claims. The disclosed technology can be related to a reconditioning wafer comprising a carrier substrate that supports at least one 2-dimensional array of regularly spaced protrusions (e.g., substantially regularly spaced protrusions) configured to form indentations in a support surface of a wafer holding stage. In various implementations, the protrusions within the same array can have substantially the same shape and substantially the same dimensions, thereby enabling a more reliable reconditioning process compared to prior art solutions. The protrusions may have the form of pyramids or pillars or other similar shapes, e.g., with at least the tip of the protrusions formed of a material suitable to make the indentations. The reconditioning wafer can be obtainable by several possible manufacturing methods, such as by applying a molding technique wherein an array of molds is created in a mold substrate. The molds can be filled with an indentation material such as diamond, and bonded to the carrier substrate. The mold substrate can be removed, e.g., by thinning and wet etching.

The reconditioning wafer may be produced in such a way that the indentation material can be present as a non-continuous layer that does not cover the entire surface of the carrier wafer. For example in the case of a diamond layer formed on a silicon carrier, this can be advantageous in various implementations in terms of diminishing or eliminating the bowing of the wafer.

The disclosed technology can be related to a reconditioning wafer configured to make indentations in a wafer support surface of a wafer holding stage in a semiconductor manufacturing or treatment tool. The reconditioning wafer can comprise a carrier substrate and on a planar surface of the carrier substrate, at least one 2-dimensional array of regularly spaced protrusions (e.g., substantially regularly spaced protrusions). The protrusions can have substantially the same shape and substantially the same dimensions and at least the tip of the protrusions can be formed of a material, hereafter referred to as the indentation material, that is suitable to make the indentations. The indentation material can be, in some instances, different from the material of the carrier substrate.

According to an embodiment, the indentation material can be chosen from the group consisting of undoped diamond, doped diamond, a carbide, an oxide, a nitride, a metal alloy, a metal.

According to an embodiment, a continuous layer of the indentation material can conformally cover the entire array of protrusions, including the surface of the carrier substrate in between the protrusions.

Alternatively, the indentation material may be present in the form of a non-continuous layer that is present at least on the tip of the protrusions.

According to an embodiment, the shape of the protrusions can be chosen from the group consisting of: a four-sided pyramid, a three-sided pyramid, a truncated pyramid, a cone, a pillar, a pyramid or a cone on top of a pedestal.

According to an embodiment, the protrusions can comprise one or more nano-sized tip portions on their outer surface. The tip portions can be considerably smaller than the protrusions.

According to an embodiment, a plurality of arrays of protrusions can be arranged on the surface of the carrier substrate. The protrusions of at least one array can be different from the protrusions of the other arrays.

The reconditioning wafer of the disclosed technology may comprise an additional layer that covers at least an area of the carrier substrate that corresponds to the array of protrusions. The thickness of the additional layer can be lower than the height of the protrusions, so that the tip of the protrusions (e.g., only the tip in some implementations) sticks out from the surface of the additional layer. For example, the additional layer can have a thickness that is less than the height of the protrusions so that the tip of the protrusions extends outwardly from the surface of the additional layer. The additional layer may be formed of a material that is suitable to pick up debris from the support surface of the wafer holding stage.

According to an embodiment, the planar surface of the carrier substrate can comprise, in an area apart from the at least one array of protrusions, a layer formed of a material that is suitable to pick up debris from the support surface of the wafer holding stage.

The disclosed technology can be related to a method of producing a reconditioning wafer, e.g., in accordance with any one of the preceding paragraphs, comprising:

Providing a mold substrate,

By lithography and etching, producing one or more two dimensional arrays of regularly spaced molds (e.g., substantially regularly spaced molds) in the mold substrate, the molds having substantially the same shape and dimensions, the molds having slanted sidewalls and an apex area, Depositing a layer of the indentation material on the mold substrate, thereby at least partially filling or lining the molds with the indentation material, so that the indentation material is deposited at least on the bottom of the molds, Bonding the mold substrate to a carrier substrate, by bonding the layer of indentation material or one or more further layers deposited on top of the layer of indentation material to the carrier substrate, Removing the mold substrate to reveal the outer surfaces of the protrusions. The removal, in some instances, can involve thinning the mold substrate and removing the thinned mold substrate by wet etching.

According to an embodiment of the method:

a mask layer comprising nano-sized mask particles is formed on the protrusions, the nano-sized mask particles being deposited in the molds prior to filling the molds, and/or deposited on the protrusions after removing the mold substrate.

The protrusions can be subjected to a plasma etch procedure. The mask layer can act as an etch mask during the etching of the indentation material. The etch procedure and the etch mask can be configured to produce one or more nano-sized tip portions formed of the indentation material. The one or more tip portions can be considerably smaller than the protrusions formed after removing the mold substrate.

According to one embodiment, the protrusions can be pyramid-shaped and at the end of the plasma etch procedure, one or more nano-sized tip portions can be present on the apex area of the protrusions. In some instances, no tip portions may be present on the side planes of the protrusions, e.g., through one or a combination of the following effects:

a higher concentration of masking particles can be deposited on the apex area than on the side planes, during the plasma etch procedure, and/or the protrusions can comprise a core and on the core a layer of the indentation material, and the thickness of the layer can be higher on the apex area than on the side planes, so that at the end of the plasma etch procedure, the indentation material can be removed from the side planes.

An alternative method of producing a reconditioning wafer according to the disclosed technology can comprise:

providing a substrate having a planar upper surface, producing a mask layer on the planar upper surface, patterning the mask layer to form a regular array (e.g., substantially regular array) of islands of masking material, subjecting the substrate to a dry etch process to thereby create cone-shaped or pillar-shaped protrusions in the substrate at the locations of the islands, coating at least the upper part of the protrusions with a layer of the indentation material.

Another alternative method of producing a reconditioning wafer according to the disclosed technology can comprise:

providing a first substrate having a planar upper surface, depositing a layer of the indentation material on the planar upper surface and bonding the first substrate to a carrier substrate, by bonding the layer of indentation material or one or more further layers deposited on top of the layer of indentation material to the carrier substrate, removing the first substrate, to obtain the carrier substrate with the layer of indentation material bonded thereto, producing a mask layer on the layer of indentation material and patterning the mask layer to form a regular array (e.g., substantially regular array) of islands of masking material, subjecting the layer of indentation material to a dry etch process to thereby create cone-shaped or pillar-shaped protrusions formed of the indentation material at the locations of the islands.

BRIEF DESCRIPTION OF THE DRAWINGS

FIGS. 2a, 2b, 2c, 2d, 2e, 2f, and 2g illustrate various intermediate structures of a process of manufacturing the wafer shown in FIG. 1, using a molding technique.

FIGS. 3a, 3b, and 3c illustrate various intermediate structures of an embodiment wherein the diamond coating is not continuous across the reconditioning wafer.

FIGS. 4a and 4b illustrate how molds may be partially filled in the manufacturing process.

FIGS. 5a and 5b illustrate another form of partially filled molds used in the manufacturing process.

FIG. 6 illustrates the formation of arrays of nano-cones and nano-pillars on a reconditioning wafer according to some embodiments of the disclosed technology.

FIG. 10 illustrates an example protrusion provided with a plurality of nano-sized tips across the outer surface of the protrusion.

FIGS. 11a, 11b, and 11c illustrate the appearance of a $SiO_xC_y$ layer formed at the beginning of diamond growth in a silicon mold according to some embodiments of the disclosed technology.

DETAILED DESCRIPTION OF CERTAIN ILLUSTRATIVE EMBODIMENTS

Figure 1:
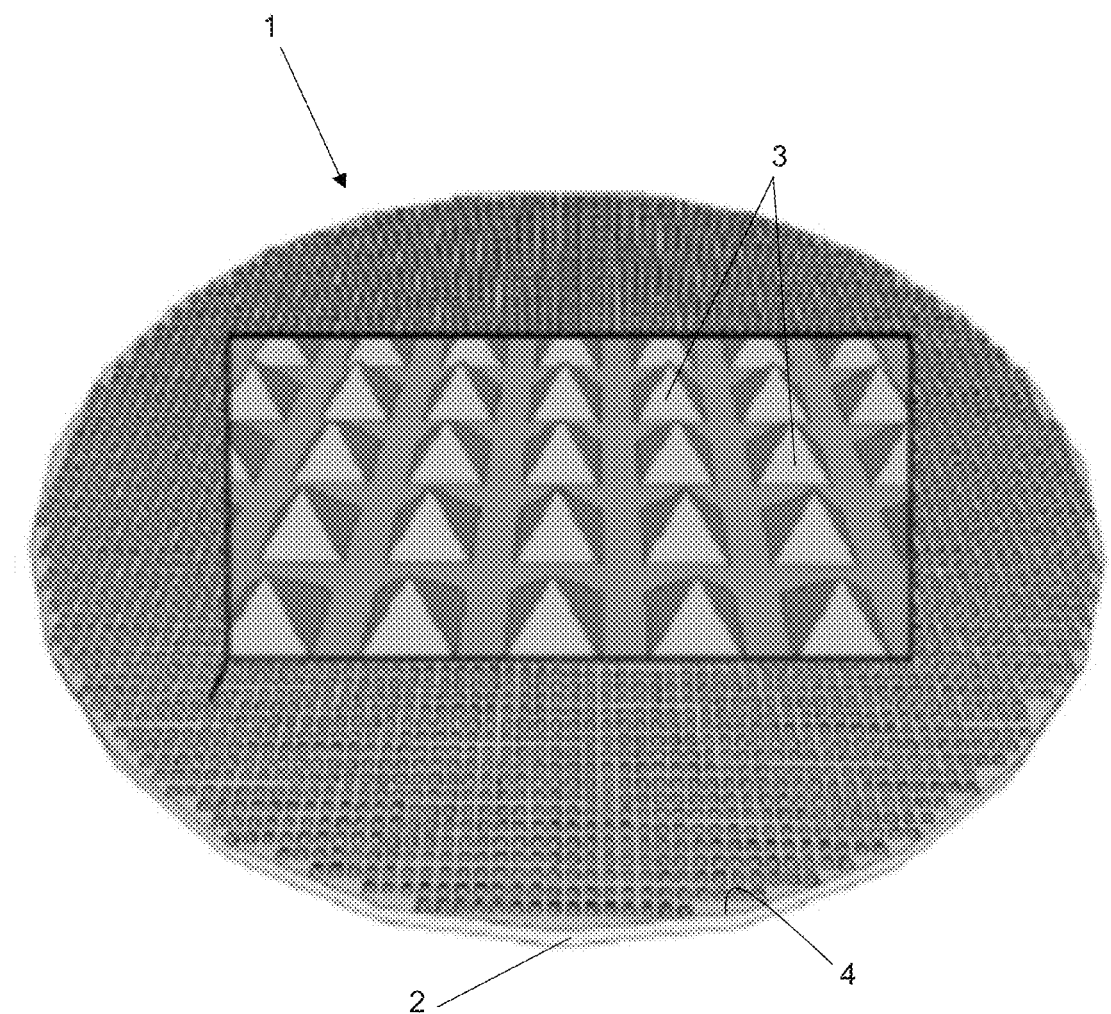
FIG. 1 shows a reconditioning wafer according to one embodiment of the disclosed technology, comprising pyramid-shaped diamond-coated protrusions.

An example embodiment of a reconditioning wafer 1 according to the disclosed technology is illustrated in FIG. 1. The middle image shows detail of a portion of the wafer's upper surface. The reconditioning wafer comprises a carrier wafer 2 comprising on its surface an array of regularly spaced (e.g., substantially regularly spaced) 4-sided pyramid-shaped protrusions 3 having substantially the same dimensions and thereby substantially the same sharpness. In this particular embodiment, a diamond layer 4 forms the outer surface of the pyramid-shaped protrusions 3 and of the planar area in between the protrusions 3. The wafer can be used to recondition a DLC-coated wafer stage in the manner described herein, e.g., by bringing the wafer into contact with the DLC coated holding surfaces of the wafer stage, with the diamond coated protrusions contacting the DLC coating, and applying a pressure so that the protrusions are pressed into the DLC coating.

The use of a reconditioning wafer according to the disclosed technology can have the advantage that the protrusions can be regularly spaced (e.g., substantially regularly spaced) and can have substantially equal height and sharpness, thus enabling the reconditioning of the DLC coating in a well-defined and repeatable manner. Other shapes of the protrusions are possible, e.g., as described herein. The dimensions of the protrusions (the ground plane and height of the pyramids for example) can be designed within a wide range, e.g., from a few tenths of a nanometer to the order of micrometers. Also, in some implementations, the pitch of the array can be controlled within these orders of magnitude. The diamond layer may comprise or consist of doped or undoped diamond, but the layer 4 is not limited to a diamond layer. Any material that is suitable to make indentations in a support surface such as in the DLC coating of the wafer stage, can be used in the disclosed technology. The material of layer 4 can therefore be generally referred to as the indentation material. This material can be, in some instances, different from the material or materials of the carrier wafer 2. Other possible indentation materials are: carbides, oxides or nitrides. Metals and metal alloys are other alternatives, even though in the particular case of reconditioning a holding stage of a stepper for a silicon wafer, metals are generally not used as they are regarded as contaminants. In some implementations, metal or metal alloys may be applicable to the reconditioning of wafer stages used with other wafer types and processing tools. The indentation material does not necessarily need to be present on the whole outer surface of the protrusions 3. In any of the embodiments, the protrusions can comprise an apex area of which the outer end forms a tip suitable to make an indentation. At least the tip of the protrusions can be formed of the indentation material.

Figure 2A:
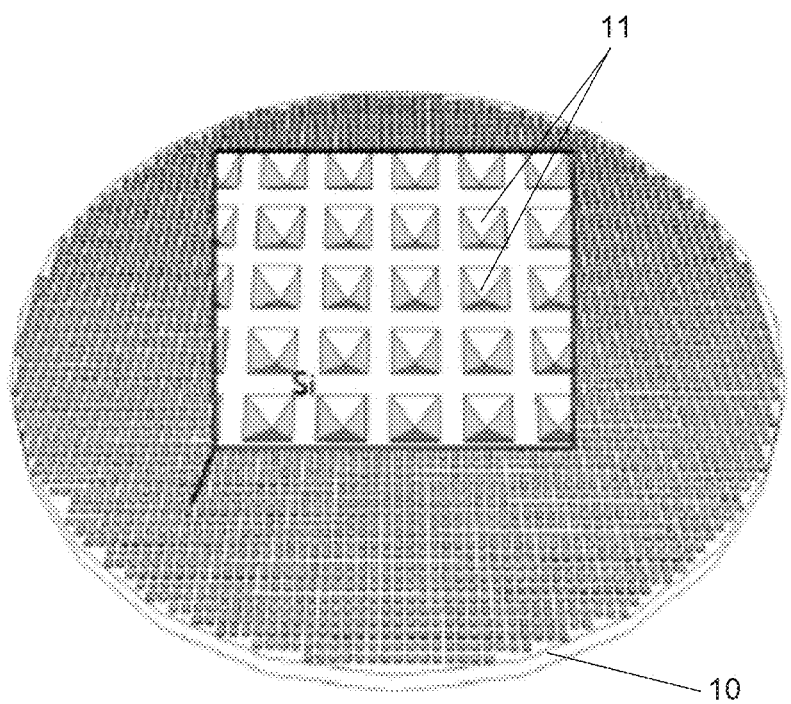

An example manufacturing process of producing the wafer of FIG. 1 is described herein. The process can apply a molding technique, e.g., from the production of diamond tips of scanning probe microscopy (SPM) applications, but now applied on a wafer scale. A mold substrate can be provided, for example a (100) Si wafer. A hardmask can be deposited on the wafer and patterned by lithography and etching. The hardmask may be a layer of $SiO_2$ or $SiO_3N_4$. The patterning can open up an array of regularly spaced (e.g., substantially regularly spaced) squares or circles in the mask, e.g., exposing square or round areas of the underlying Si. This can be followed by an anisotropic wet etching process, e.g., using KOH as the etchant. The anisotropic etch can follow the crystal planes of the (100) Si, resulting in the formation of inverted pyramid-shaped molds in the Si surface. After stripping of the hardmask, the Si mold wafer 10 as shown in FIG. 2a can be obtained. The Si-wafer can comprise a regular array (e.g., a substantially regular array) of inverted pyramid-shaped molds 11 as shown in the detail image in FIG. 2a. Each mold can comprise slanted sidewalls and an apex area at the bottom. In the embodiment shown, the array is present on the entire wafer surface. Alternatively, the array may cover just a portion of the surface, or several arrays may be distributed on the surface.

Figure 2B:
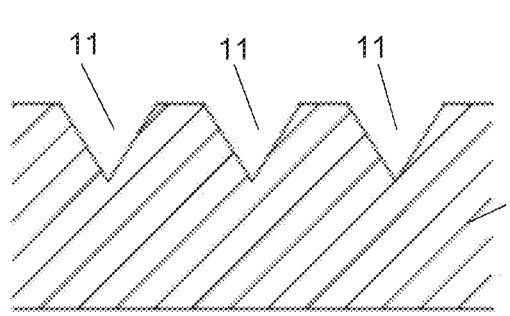

FIG. 2b shows a local cross-section through the center of three of the molds 11. Diamond seed particles (not shown) can be deposited on the mold wafer 10, e.g., in the molds 11 and on the Si-surface in between the molds 11. For example from the fabrication of SPM probes, the deposition of the nano-sized seed particles may be done by immersion seeding. The wafer 10 including the molds 11 can be immersed into a colloidal solution of the particles in a solvent such as ethanol or $H_2O$. The potential of these diamond nanoparticles can be adjusted to be opposite of the potential of the Si mold wafer 10 which can result into attraction and deposition of these diamond nanoparticles onto the Si surface.

Figure 2C:
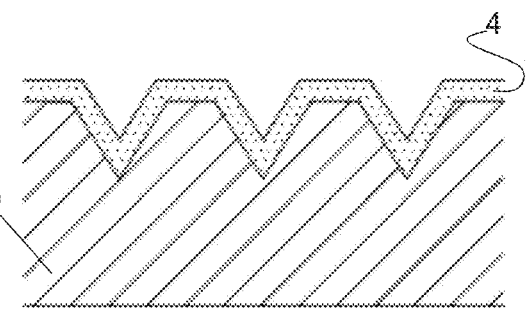

As illustrated in FIG. 2c, this can be followed by the deposition of a diamond layer 4 by chemical vapor deposition (CVD), for example hot filament CVD (HFCVD). The diamond layer 4 can be formed by heteroepitaxial growth starting from the seed particles, eventually forming a diamond layer 4 inside the molds 11 and on the Si-surface in between the molds 11. The diamond layer 4 may fill up the molds 11 completely or form a layer on the slanted sidewalls of the molds (as is the case in the drawings), depending on the size of the molds 11 and the thickness of the deposited diamond layer 4. The diamond layer 4 may have a thickness in the order of 1 micrometer in some implementations. The diamond layer 4 may be doped or undoped.

Figure 2D:
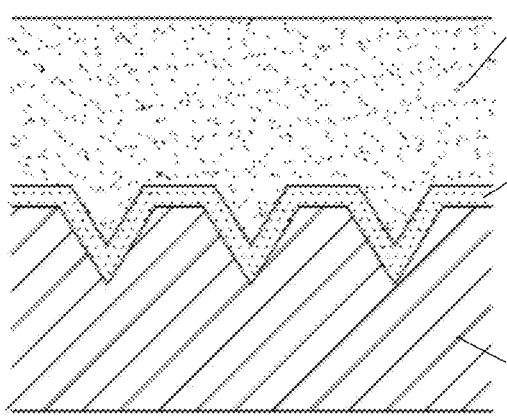

As illustrated in FIG. 2d, a carrier wafer 2 can be bonded to the diamond layer 4. Possibly the diamond layer 4 can be planarized by a chemical mechanical polishing (CMP) process, e.g., prior to the bonding step. The carrier 2 may be a silicon wafer. Direct bonding of the diamond layer 4 to a silicon carrier wafer 2 may be done by pressing the two surfaces against each other in high vacuum or ultra-high vacuum with a bonding pressure of about 30-50 MPa at about 1000 to 1100° C. for about 0.5 to 3 hours. Alternatively, the bonding process may involve the production of one or a stack of bonding layers (not shown) on the diamond layer 4 and/or on the silicon carrier wafer 2. A bonding layer stack may include oxide layers, metal layers or organic layers. For example, a silicon or silicon oxide film may be deposited on the diamond layer 4 and the silicon carrier wafer 2 can be pressed against the silicon or silicon oxide surface with a bonding pressure of about 30 to 50 MPa at about 400 to 500° C. for about 0.5 to 3 hours. In the case shown, according to which the molds 11 are lined with the diamond layer 4, the bonding layer or layer stack may fill the remaining cavities of the molds and form a planar surface, e.g., possibly after CMP, that is subsequently bonded to the carrier 2.

Figure 2E:
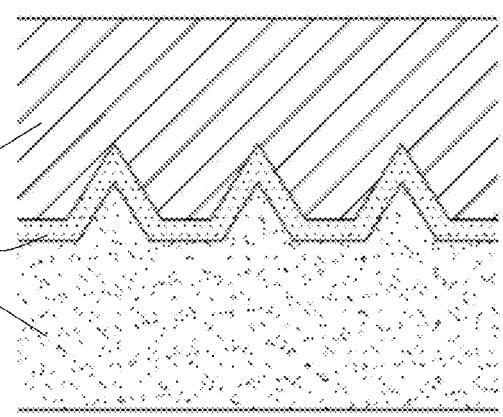

As illustrated in FIGS. 2e and 2f, the bonded assembly of the Si mold wafer 10 and the carrier wafer 2 can be flipped and the mold wafer 10 can be thinned by grinding and/or chemical mechanical polishing to a thickness in the order of a few tenths of a micrometer in some instances. The remainder of the mold wafer 10 can be removed by wet etching, e.g., using KOH as the etchant, until the diamond layer 4 is exposed, resulting in the reconditioning wafer 1 comprising the protrusions 3 as shown in FIG. 2g, and illustrated in in FIG. 1. The thickness of the carrier wafer 2 can be chosen in such a way that a desired contact pressure (hence diamond tip penetration depth) is achieved. This is possible in various implementations as the number of diamond tips and their sharpness can be known (e.g., exactly known in some cases) which is not the case for the prior art.

The disclosed technology is not limited to the above-described embodiments and many variations and alternatives are possible. After filling the molds 11, the diamond layer 4 may be further processed by lithography and etching, as illustrated in FIG. 3a for example, where after the deposition of the diamond layer 4 on the surface of the mold wafer 10, the diamond layer 4 can be etched away except in the molds 11 and in an area in the vicinity (e.g., immediate vicinity in some instances) of the molds 11. The diamond could even be partially etched away inside the mold, leaving only a diamond layer around the apex area of the mold. A layer or layer stack 15 can be deposited, as seen in FIG. 3b. This may be a silicon or silicon oxide layer deposited by CVD or sputtering for example. Alternatively (e.g., for applications where the use of a metal does not raise contamination concerns), it may be a stack of metal layers, for example a combination of copper (Cu) (e.g., about 50 nm) as a seed layer for nickel (Ni) electroplating, and Ni (e.g., about 5 microns). The layer or layer stack 15 can fill the remaining hollow portion of the molds 11 and the areas where the diamond was etched away. The carrier wafer 2 can be bonded to the layer or layer stack 15, by a suitable stack of bonding layers, after which the mold wafer 10 can be removed by thinning and wet etching, leading to the result shown in FIG. 3c. The diamond layer 4 can be a non-continuous layer, formed of individual diamond patches on and in the vicinity (e.g., immediate vicinity in some instances) of the pyramids 3, while the area in between the patches can be formed by the layer or layer stack 15. This is one example of an embodiment wherein the indentation material forms a non-continuous layer covering at least the protrusions 3. The non-continuous layer could also be formed of multiple separate patches, e.g., each patch covering a sub-group of protrusions of the array and the surface area between the protrusions of the sub-group. A layer or layer stack 15 may separate the patches from each other. The embodiments having a non-continuous layer of the indentation material, e.g., when the material is diamond, can be advantageous in terms of the wafer's resistance to bowing. When the diamond layer is non-continuous, wafer bowing can be decreased or eliminated without requiring anti-stress coatings or other measures.

Another way of obtaining a non-continuous diamond layer can be by partially filling or lining the molds 11 with the indentation material. This may be realized for example by depositing diamond seed particles in a limited area (e.g., only in a limited area in some instances) that includes the apex area of the mold by applying a hardmask on the remainder of the mold, resulting in diamond layers as illustrated in FIG. 4a. This can be followed by the deposition of a layer or layer stack 15, e.g., prior to bonding to the carrier wafer 2, as illustrated in FIG. 4b.

Another fabrication method which falls under the term partially filling or lining the molds, can be to apply a lower density of the seed particles than used to obtain a closed diamond layer 4. The resulting diamond layer can be a non-closed layer 4 as illustrated schematically in FIG. 5a. The diamond growth can be continued until at least the apex areas of the molds are covered with diamond. This can be followed by the deposition of a layer or layer stack 15, e.g., prior to bonding to the carrier wafer 2, as illustrated in FIG. 5b.

The protrusions 3 may have other shapes besides the four-sided pyramids illustrated in the drawings. For example, (311) Si wafers can be used to create three-sided pyramidal structures by a similar molding technique described herein. (110) Si or 45° oriented (100) Si can be used to create pillar-like structures by a similar molding technique.

Also, nano-cones 5 and/or nanowires 6 may be used as protrusions, as illustrated in FIG. 6. These can be produced by a similar molding technique described herein, but wherein the molds can be shaped as inverted nano-cones or nano-wires. These molds can be obtainable by producing a hardmask that exposes a regular array (e.g., a substantially regular array) of round openings on the surface of the mold substrate, and etching the exposed material of the mold substrate by a dry (e.g., plasma) etch process. Alternatively, a blanket diamond layer of for example 1 micrometer thick may be deposited on a flat silicon wafer (e.g., without molds), and bonded to a carrier wafer as described herein. The silicon wafer can be removed (also as described herein), resulting in the carrier wafer with a smooth diamond layer on its surface. The diamond layer can be patterned by producing a lithographic mask on the diamond layer. In some instances, the mask can be formed of nano-sized circular mask portions at regular distances (e.g., substantially regular distances). A dry etch process, for example a plasma etch using $O_2$ as the plasma gas, can thin or remove the diamond around the circular areas, thereby creating a regular array (e.g., a substantially regular array) of nano-cones or nano-wires. The circular mask portions can in the end be consumed by the etch process, but much slower than the diamond layer, hence the formation of cones or wires. The shape of the resulting diamond protrusions can be a cone for shorter etch times and can become more pillar-shaped as the etch time is longer, due to the slight isotropy of the oxygen-based plasma etch.

Figure 7:
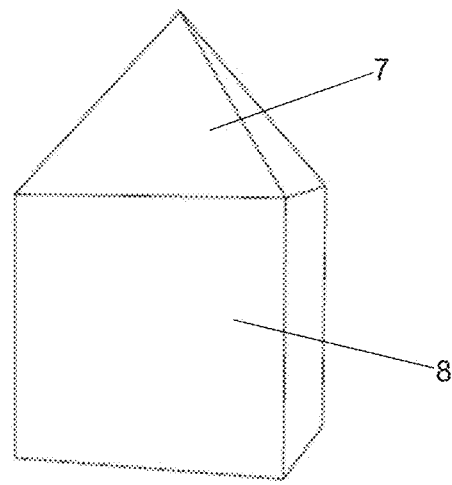
FIG. 7 illustrates an example protrusion in the form of a pyramid on top of a pedestal.

The protrusions may also have the form of a pyramid 7 on a pedestal 8 as illustrated in FIG. 7. This may be realized by a molding technique described herein for pyramid-shaped protrusions, including the use of a hardmask that can define an array of square openings. Before the anisotropic etch process, a dry isotropic etch can be done in the square areas defined by the hardmask. The dry etch can result in the formation of pillar-shaped molds in the mold substrate. This can be followed by the anisotropic KOH-based etch, which can form pyramid-shaped molds at the bottom of the pillar-shaped molds, resulting in molds having the inverted shape of the protrusion shown in FIG. 7. In some instances, a selective oxidation and patterning can be applied, e.g., after the dry etch to protect the sidewalls from etch attack during anisotropic etching.

Another possible shape for the protrusions can be a pedestal in the form of a pillar with a circular cross section and with a cone-shaped element on top of the pillar and substantially concentric with the pillar. The ground plane of the cone-shaped element can have the same diameter (e.g., substantially the same diameter) as the cross-section of the pillar. This may be obtained by depositing a blanket diamond layer of for example 1 micrometer thick on a flat (e.g., substantially flat) silicon wafer (e.g., without molds), and bonding the diamond to a carrier wafer as described herein. The silicon wafer can be removed (also as described herein), resulting in the carrier wafer with a smooth (e.g., substantially smooth) diamond layer on its surface. A hardmask can be applied in the form of a regular array (e.g., substantially regular array) of circular masked areas. This can be followed by dry etching with a pronounced anisotropic etching defining the pillar shapes and dry etching with a pronounced isotropic underetching of the circular mask areas defining the nano-cones.

A truncated pyramid-shape is also possible, which may be produced by creating molds with truncated bottoms, by adjusting the dimensions of the openings created in the hardmask referred to herein, e.g., prior to the anisotropic etch process of producing the molds.

As illustrated in FIG. 6, a reconditioning wafer according to the disclosed technology may comprise a plurality of arrays of regularly spaced protrusions (e.g., substantially regularly spaced protrusions). An array can comprise or consist of protrusions of the same (e.g., substantially the same) shape and dimensions. The arrays can be different one from the other, e.g., in terms of one or more characteristics of the protrusions, including the shape, the dimensions and the spacing. This can allow use of a single reconditioning wafer to perform reconditioning operations with different requirements.

Figure 8:
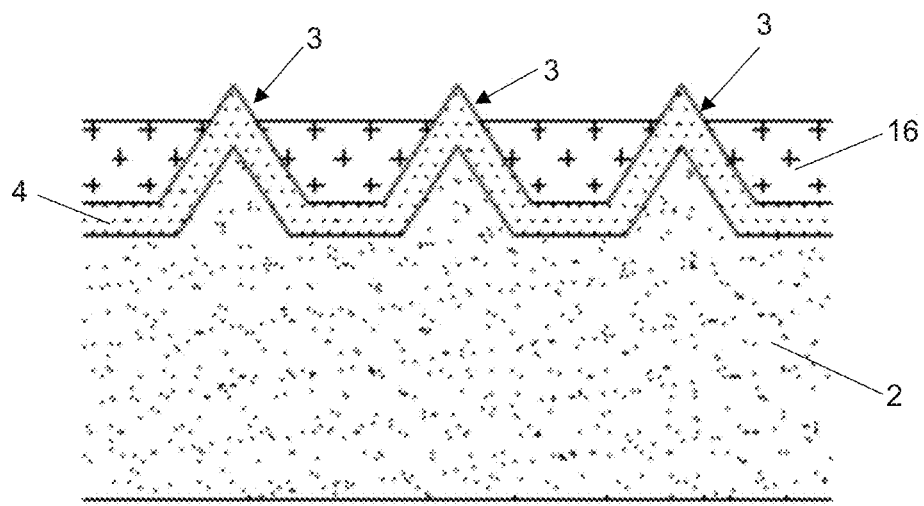
FIG. 8 illustrates an embodiment, wherein an organic layer is present on the reconditioning wafer, with the tips of the protrusions sticking out of the organic layer.

According to an embodiment, an additional layer or layer stack may be deposited on the side of the reconditioning wafer comprising the protrusions. FIG. 8 illustrates an embodiment wherein an organic layer 16 is formed on the surface of the carrier wafer 2. In this example, the thickness of the organic layer 16 does not exceed the height of the protrusions 3, so that the tips of the protrusions 3 stick out of the organic layer 16 (e.g., extend outwardly from the organic layer). The layer 16 may for example be formed of a silicon gel or PDMS (polydimethylsiloxane). The layer 16 can facilitate the conditioning operation as it acts as a penetration stop. At the same time, the layer 16 may serve as a debris clean-up layer, as debris present on the reconditioned wafer support surfaces may be picked up by adhering to the layer 16. The layer 16 may be produced by spin-on coating or vapor phase deposition.

According to an embodiment, the reconditioning wafer can comprise one or more arrays of protrusions as described herein, and can comprise at least one area comprising a debris cleaning layer as described herein but without protrusions therein. This embodiment can allow a reconditioning operation and debris cleaning (e.g., a reconditioning operation followed by debris cleaning), using the same reconditioning wafer.

A reconditioning wafer according to the disclosed technology can be produced in a variety of sizes, e.g., ranging from about 2 cm in diameter to about 300 mm. Pyramid-shaped protrusions with increased sharpness may be produced by subjecting the mold substrate 10, e.g., after the creation of the molds 11 (e.g., as in FIGS. 2a and 2b), to oxidation at low temperature. This can have the effect of sharpening the bottom of the molds 11, as described for example in document "Low temperature thermal oxidation sharpening of microcast tips", *Journal of Vacuum Science & Technology B: Microelectronics and Nanometer Structures Processing, Measurement, and Phenomena* 10, 2307 (1992).

Figure 9A:
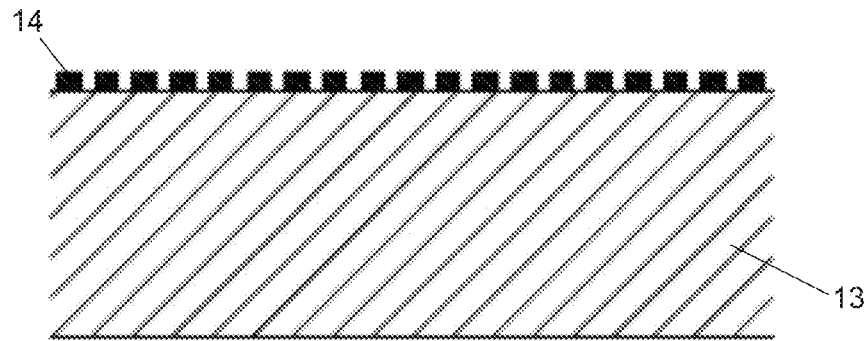
FIGS. 9a, 9b, and 9c illustrate various intermediate structures of another method of producing a reconditioning wafer according to some embodiments of the disclosed technology.
Figure 9B:
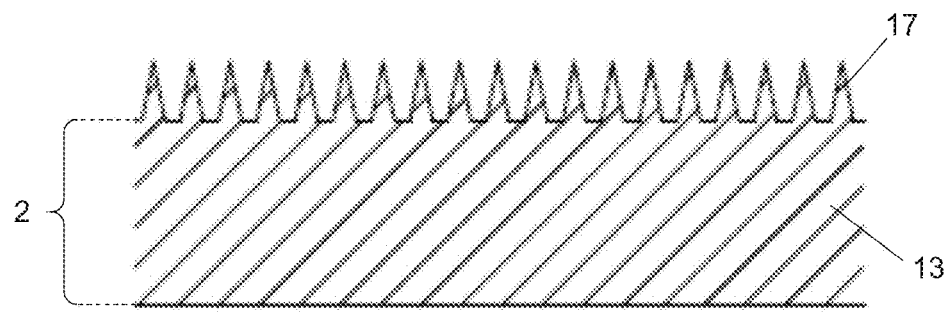
Figure 9C:
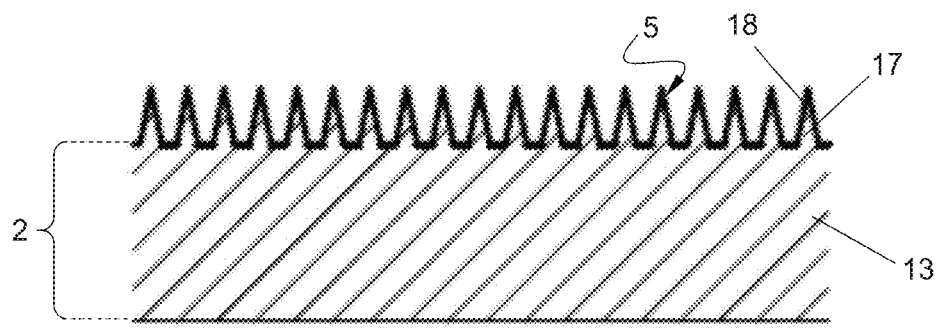

Another method of producing a reconditioning wafer according to the disclosed technology is illustrated in FIGS. 9a to 9c. In various implementations, this method does not require molding nor bonding to a carrier wafer. A monocrystalline silicon wafer 13 (or a wafer having a monocrystalline Si layer 13 on its surface) can be provided and a lithographic mask can be produced on the upper surface of the wafer. The mask can be formed as a regular array (e.g., substantially regular array) of islands 14 of masking material. The islands may have a circular cross-section. The wafer 13 can be etched by a plasma etch process, resulting in the creation of a regular array (e.g., substantially regular array) of silicon cones 17 on the surface of the remaining bulk portion 2 of the silicon wafer. This bulk portion 2 can be the carrier substrate. When the etch time is longer, the shape can become more pillar-like due to the slight isotropic character of the dry etch process. A diamond layer 18 can be applied conformally on the array of Si cones, resulting in an array of diamond-coated cone-shaped protrusions 5 suitable to recondition a wafer stage. Optionally, the diamond layer 18 could be patterned by lithography and etching to remove the diamond in between the cones and maintain the diamond at least on the apex area of the cones, to thereby form separate diamond coatings on the respective Si cones. Various implementations can have similar advantages in terms of wafer bowing as the embodiments shown in FIGS. 3c, 4b and 5b.

According to an embodiment, one or more nano-sized tips can be present on the outer surface of the protrusions. An example is illustrated in FIG. 10, where a pyramid-shaped diamond protrusion 3 is shown that is covered by a plurality of nano-sized diamond tips 20, which also cover the diamond layer around the protrusion 3. The nano-sized tips 20 are shown as a regular array but in reality the tips can be distributed more randomly and/or more closely spaced on the outer surface of the protrusion 3. The dimensions of the nanotips can be in the order of nanometers, for example a height of about 50 to about 100 nm. The radius of the apex area of the nanotips can range from less than about 1 nm up to a few nanometers. The nanotips can be small with respect to the dimensions of the protrusions 3. This embodiment can be applicable when the dimensions of the protrusions are considerably larger than the order of magnitude of the nanotips. When the nanotips are present, the shape and the dimensions of the protrusions may be defined taking into account an average height of the nanotips which can be derived from SEM images or the like.

The formation of nano-tips 20 may be realized by a self-aligned dry etching process e.g., described herein in the case of diamond or diamond coated pyramid-shaped protrusions obtained by the molding technique. The diamond seed particles referred to herein can act as masks during the production of the nano-tips 20. At least a portion of these particles can be non-doped diamond particles. The density of the seed particles when deposited in the mold may be in accordance with methods of producing SPM tips, for example between $1E10/cm^2$ and $5E10/cm^2$. In some implementations, the density may be controlled within a larger range of $1E9/cm^2$ and $1E11/cm^2$ e.g., by adjusting the seeding dispersion chemistry, the particle and substrate potential, and/or the seeding time. The applied density can be such that it enables the growth of a closed (e.g., fully coalesced) or substantially closed (e.g., substantially fully coalesced) diamond layer in the mold. According to an embodiment, the particles can comprise or consist of a mixture of non-doped diamond particles and doped diamond particles, deposited at any of the above-described densities. Both the doped and non-doped particles can enable the growth of a closed diamond layer. In some instances, the non-doped particles can act later on as masks used during the creation of the nano-tips. The diameter of the individual particles can be typically about 3 to about 5 nm but they can cluster to aggregates leading to a size distribution of typically about 5 to about 25 nm.

In order to produce the nanotips 20, the diamond layer 4 deposited in the molds 11 as shown in FIG. 2c can be a doped diamond layer. The dopant may be boron. The above-described method can be completed and the reconditioning wafer 1 shown in FIG. 2g can be obtained. The wafer 1 can be subjected to a plasma etch procedure. This may be reactive ion etching (RIE) or inductive coupled plasma (ICP) etching, configured so that the non-doped diamond seed particles can have a lower etch rate than the doped diamond of the protrusions 3. For example, the particles can be etched slower than the doped diamond, e.g., the particles can act as an etch mask used during the etching of the doped diamond. A suitable etch process having this effect can be a plasma etch using $O_2$ as the plasma gas, e.g., referred to herein. At the beginning of the process of growing diamond in the Si molds 11, a thin (e.g., typically 1-5 nm thick) silicon oxycarbide layer can be spontaneously formed with a non-uniform thickness. Silicon oxycarbide can be the compound $SiO_xC_y$, with x<2 and y>0. Like the non-doped seed particles, the $SiO_xC_y$ layer can be etched slower by an $O_2$ plasma etch than the doped diamond, e.g., the $SiO_xC_y$ also can act as an etch mask.

As illustrated in FIG. 11a, the $SiO_xC_y$ layer 21 can be formed on the mold surface 22, in the spaces between adjacent seed particles 23, and can grow thicker until the space in between the growing doped diamond islands 24 is closed (e.g., substantially closed) and a fully coalesced (e.g., substantially fully coalesced) diamond film 4 is formed. The outer surface of the protrusion 3 after the removal of the mold substrate 10 is shown in FIG. 11b. The $SiO_xC_y$ layer 21 together with the seed particles 23 can form a layer 25 of irregular thickness, visualized by the bold lines in FIG. 11b. When the array of protrusions 3 is subjected to $O_2$-plasma etching, the $SiO_xC_y$ portions 21 and the nanoparticles 23 can be slowly etched away, e.g., until parts of the doped diamond layer 4 become exposed. This can happen locally due to the irregularity of the thickness of layer 25. At these locations, doped diamond can be etched at a higher speed than the $SiO_xC_y$ 21 and the seed particles 23. As the $O_2$ etch process continues, sharp nano-sized doped diamond tip portions 20, also referred to as nanotips, can be formed in the diamond layer 4, resulting in a hedgehog tip structure illustrated in FIG. 10.

According to another etch procedure capable of obtaining the structure shown in FIG. 10, the protrusions 3 can be first subjected to a short plasma etch using $SF_6$ or a mixture of $SF_6$ and $O_2$ as the plasma gas, for example for about 20 s. This short flash etch can create craters 26 in the $SiO_xC_y$ layer 21, as illustrated in FIG. 11c. This can be followed by an $O_2$ plasma etch as described herein. In some implementations, the prior removal of a portion of the $SiO_xC_y$ can lead to a quicker exposure of the doped diamond layer 12, so that the hedgehog structure of FIG. 10 can be obtained in an overall shorter timespan.

Apart from the $SiO_xC_y$ layer 21 and the seed particles 23 acting as an etch mask, another masking effect may occur during the plasma etch procedure itself. The energy of the plasma may release particles from materials inside the etch chamber and/or from layers formed of other materials surrounding the diamond protrusions 3, as in the case of the embodiment of FIG. 3c for example, wherein the protrusions 3 are surrounded by a metal layer 15, for example a Ni layer.

Ni-particles can be released by sputtering under the influence of the ion bombardment generated by $O_2$, $SF_6$ or $SF_6/O$ plasma. Also because of the bombardment with ions from the plasma, the pyramids 3 can gain static charge, resulting in an electric field, which can attract the Ni-particles. The Ni-particles can thereby be deposited on the pyramids. In various implementations, the Ni may not be etched by $SF_6$ nor by $O_2$ plasma, so that the Ni-particles can also act as etch masks in a similar way as the seed particles 23 and $SiO_xC_y$ layer portions 21. The field can be stronger where the surface is sharper, e.g., at the pyramid plane edges and mostly at the apex. The concentration of Ni-particles can be higher in these areas, which may be exploited in the production of specific tip structures. When the dry etch is stopped sufficiently early, e.g., before etching away the nanotips 20 themselves, the described masking effects, the $SiO_xC_y$ 21, the seed particles 23 and the Ni-particles can have the combined effect of producing the hedgehog structure illustrated in FIG. 10. In some implementations, the $SiO_xC_y$ and seed particle effects can be more important at the start of the etch process, and may be the dominant processes in the case of thin diamond layers 12, e.g., about 100 nm. For thicker diamond layers, e.g., 1 micrometer, or full diamond protrusions 3, all the effects can contribute to the formation of the nanotips 20 and the Ni-sputtering effect can become dominant after the $SiO_xC_y$ and the seed particles have been etched away.

The etch procedures described herein can be stopped when the nanotips 20 have obtained a given shape and aspect ratio. In the case of the described $O_2$ plasma etch of a diamond tip, the $O_2$-etch duration can define the shape of the nanotips. In some implementations, at first, the nanotips can be cone-shaped pillars, as illustrated in FIG. 10. As the etch process is applied longer, the nanotips can become more needle shaped, e.g., due to a slight isotropy of the dry etch process. The etch time can be controlled to obtain a given shape. When the etch process is stopped, portions of the seed particles and/or the $SiO_xC_y$ layer and/or of the sputtered particles may still be present on the nanotips 20. For some applications, these remnants of the etch mask are not a problem and they may remain. Otherwise, in some implementations, a slight oxygen overetch may burn away these remnants. The etch process can be self-aligned, and use no lithographic mask other than the particles, $SiO_xC_y$ layer or other contributors to the mask layer referred to herein.

Figure 12A:
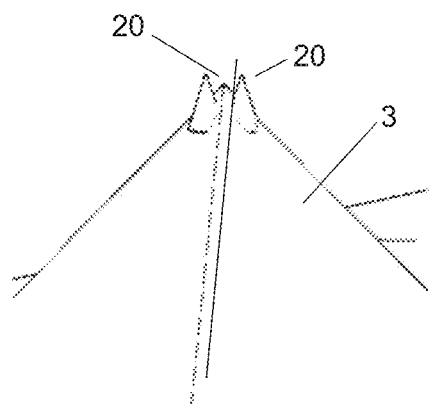
FIGS. 12a and 12b illustrate example pyramid-shaped protrusions with a few or only one nano-sized tip portion in the apex area of the protrusion.
Figure 12B:
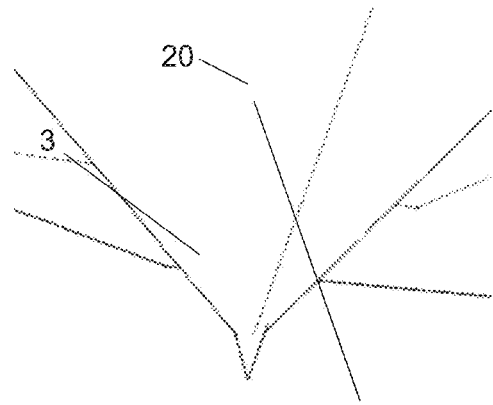

According to an embodiment, the dry etch process can be continued until the nanotips 20 are etched away on the side planes of the pyramids. However, one or more nanotips 20 can be formed on the apex area of the pyramids, as schematically illustrated in FIGS. 12a and 12b. This structure may be obtained by exploiting one or more effects, possibly occurring simultaneously. In the case of the diamond-coated protrusions/silicon molds/Ni layer setup described herein, the sputtering of Ni particles during the etch process can be one effect that contributes to this type of structure. As stated herein, the electric field generated by the ion bombardment can be stronger where the surface is sharper, e.g., at the pyramid plane edges and mostly at the apex. The field attracts the Ni particles, so there can be more etch mask particles at the apex than on the sidewalls. In some implementations, as a consequence, while the diamond layers 4 on the sidewalls of the protrusions can be completely etched away, one or more sharp diamond tips 20 can remain on the apex regions. After the etch procedure, the protrusions 3 can be, in some instances, therefore entirely formed by Ni, except for the sharp diamond tips 20 in the apex areas.

Figure 13:
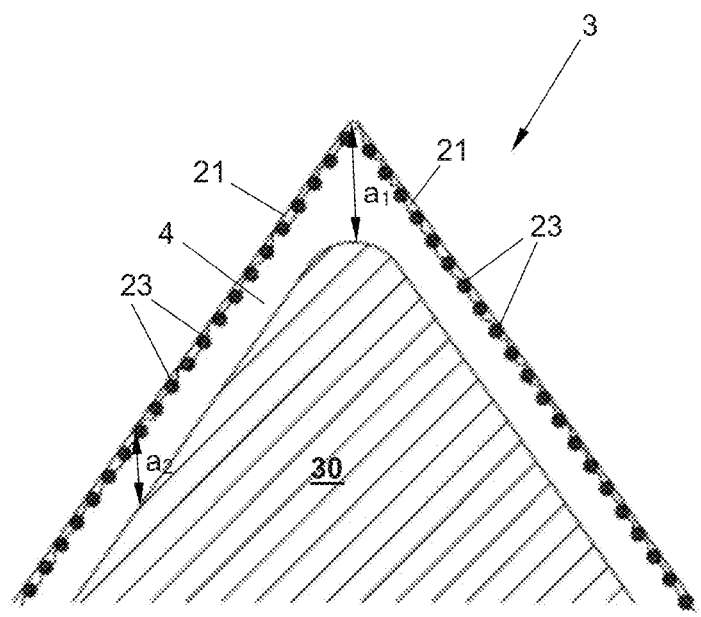
FIG. 13 illustrates an example pyramid-shaped protrusion having a thicker diamond layer on the apex area than on the side planes of the protrusion.

Another contributor to realizing the latter embodiment can be that the diamond layer 4 may be thicker near the apex region compared to on the side planes of the pyramids. This is illustrated in FIG. 13, which shows a cross-section of a diamond coated pyramid-shaped protrusion 3, having a Ni core 30 and a doped diamond layer 4. FIG. 13 also shows schematically the presence of the non-doped diamond seed particles 23 and of the $SiO_xC_y$ layer 21. It is seen that the thickness of the diamond layer 4, as measured in the direction perpendicular to the ground plane of the pyramid, can be larger at the apex region (thickness $a_1$) than on the sides of the pyramid (thickness $a_2$). In some implementations, this may be a consequence of the deposition process applied to form the diamond layer. When the dry etching process is continued until the diamond layer 4 is removed from the sides of the pyramid, a substantial diamond thickness can remain on the apex area, e.g., due to the difference in thickness between $a_1$ and $a_2$. This can result in the appearance of one or more nanotips 20 at the apex region (e.g., at the apex region only), as illustrated in FIGS. 12a and 12b. In some instances, the number of nanotips appearing can depend on the distribution (the exact distribution in some instances) of the particles near the apex region. In some implementations, the difference between the thicknesses $a_1$ and $a_2$ may not occur or may not be sufficient to obtain the described effect. For example, it may depend on the average thickness of the diamond layer 4, and/or on specific parameters applied when producing this layer.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A reconditioning wafer configured to make indentations in a wafer support surface of a wafer holding stage in a semiconductor manufacturing or treatment tool, the reconditioning wafer comprising:
   a carrier substrate; and
   on a planar surface of the carrier substrate, at least one 2-dimensional array of regularly spaced protrusions, the protrusions having substantially the same shape and dimensions and wherein at least the tip of the protrusions is formed of an indentation material that is suitable to make the indentations,
   wherein a continuous layer of the indentation material conformally covers the entire array of protrusions, including the surface of the carrier substrate in between the protrusions, or
   wherein the indentation material is present in the form of a non-continuous layer that is present at least on the tip of the protrusions.

2. The reconditioning wafer according to claim 1, wherein the indentation material is chosen from the group consisting of: undoped diamond, doped diamond, a carbide, an oxide, a nitride, a metal alloy, and a metal.

3. The reconditioning wafer according to claim 1, wherein the continuous layer of the indentation material conformally covers the entire array of protrusions, including the surface of the carrier substrate in between the protrusions.

4. The reconditioning wafer according to claim 1, wherein the indentation material is present in the form of the non-continuous layer that is present at least on the tip of the protrusions.

5. The reconditioning wafer according to claim 1, wherein the shape of the protrusions is chosen from the group consisting of: a four-sided pyramid, a three-sided pyramid, a truncated pyramid, a cone, a pillar, and a pyramid or a cone on top of a pedestal.

6. The reconditioning wafer according to claim 1, wherein the protrusions comprise one or more nano-sized tip portions on their outer surface, the tip portions being considerably smaller than the protrusions.

7. A reconditioning wafer configured to make indentations in a wafer support surface of a wafer holding stage in a semiconductor manufacturing or treatment tool, the reconditioning wafer comprising:
   a carrier substrate; and
   on a planar surface of the carrier substrate, at least one 2-dimensional array of regularly spaced protrusions, the protrusions having substantially the same shape and dimensions and wherein at least the tip of the protrusions is formed of an indentation material that is suitable to make the indentations, wherein a plurality of other arrays of protrusions are arranged on the surface of the carrier substrate, and wherein the protrusions of at least one array are different from the protrusions of the other arrays.

8. A method of producing a reconditioning wafer in accordance with claim 1, the method comprising:
   providing a mold substrate;
   by lithography and etching, producing one or more two dimensional arrays of regularly spaced molds in the mold substrate, the molds having substantially the same shape and dimensions, the molds having slanted sidewalls and an apex area;
   depositing a layer of the indentation material on the mold substrate, thereby at least partially filling or lining the molds with the indentation material, so that the indentation material is deposited at least on the bottom of the molds;
   bonding the mold substrate to the carrier substrate, by bonding the layer of indentation material or one or more further layers deposited on top of the layer of indentation material to the carrier substrate; and
   removing the mold substrate to reveal the outer surfaces of the protrusions of the reconditioning wafer.

9. The method according to claim 8, further comprising:
   forming a mask layer comprising nano-sized mask particles on the protrusions, the nano-sized mask particles being deposited in the molds prior to filling the molds, and/or deposited on the protrusions after removing the mold substrate;
   subjecting the protrusions to a plasma etch procedure, wherein the mask layer acts as an etch mask during the etching of the indentation material; and
   producing one or more nano-sized tip portions formed of the indentation material, the one or more tip portions being considerably smaller than the protrusions formed after removing the mold substrate.

10. The method according to claim 9, wherein the protrusions are pyramid-shaped and wherein at the end of the plasma etch procedure, one or more nano-sized tip portions are present on the apex area of the protrusions and no tip portions are present on the side planes of the protrusions, through one or a combination of the following:
  a higher concentration of masking particles deposited on the apex area than on the side planes, during the plasma etch procedure,
  the protrusions comprising a core and on the core a layer of the indentation material, the thickness of the layer higher on the apex area than one the side planes, so that at the end of the plasma etch procedure, the indentation material is removed from the side planes.

11. The method according to claim 8, further comprising:
  depositing an additional layer having a thickness that is less than the height of the protrusions so that the tip of the protrusions extends outwardly from the surface of the additional layer.

12. The reconditioning wafer according to claim 1, comprising an additional layer that covers at least an area of the carrier substrate that corresponds to the array of protrusions, and wherein the thickness of the additional layer is less than the height of the protrusions, so that the tip of the protrusions extends outwardly from the surface of the additional layer.

13. The reconditioning wafer according to claim 12, wherein the additional layer is formed of a material that is suitable to pick up debris from the support surface of the wafer holding stage.

14. A method of producing a reconditioning wafer in accordance with claim 1, the method comprising:
  providing a substrate having a planar upper surface;
  producing a mask layer on the planar upper surface;
  patterning the mask layer to form a regular array of islands of masking material;
  subjecting the substrate to a dry etch process to thereby create cone-shaped or pillar-shaped protrusions in the substrate at the locations of the islands; and
  coating at least the upper part of the protrusions with a layer of the indentation material.

15. The method according to claim 14, wherein the indentation material forms the non-continuous layer on the upper part of the protrusions.

16. The method according to claim 14, further comprising depositing an additional layer having a thickness that is less than the height of the protrusions so that the upper part of the protrusions extends outwardly from the surface of the additional layer.

17. A method of producing a reconditioning wafer in accordance with claim 1, the method comprising:
  providing a first substrate having a planar upper surface;
  depositing a layer of the indentation material on the planar upper surface;
  bonding the layer of indentation material or one or more further layers deposited on top of the layer of indentation material to the carrier substrate;
  removing the first substrate, to obtain the carrier substrate with the layer of indentation material bonded thereto;
  producing a mask layer on the layer of indentation material;
  patterning the mask layer to form a regular array of islands of masking material; and
  subjecting the layer of indentation material to a dry etch process to thereby create cone-shaped or pillar-shaped protrusions formed of the indentation material at the locations of the islands.

18. The method according to claim 17, wherein the indentation material forms the non-continuous layer on the upper part of the protrusions.

19. The method according to claim 17, further comprising depositing an additional layer having a thickness that is less than the height of the protrusions so that the upper part of the protrusions extends outwardly from the surface of the additional layer.

20. The reconditioning wafer according to claim 1, wherein the planar surface of the carrier substrate comprises, in an area apart from the at least one array of protrusions, a layer formed of a material that is suitable to pick up debris from the support surface of the wafer holding stage.

21. A reconditioning wafer configured to make indentations in a wafer support surface of a wafer holding stage in a semiconductor manufacturing or treatment tool, the reconditioning wafer comprising:
  a carrier substrate; and
  on a planar surface of the carrier substrate, at least one 2-dimensional array of regularly spaced protrusions, the protrusions having substantially the same shape and dimensions and wherein at least the tip of the protrusions is formed of an indentation material that is suitable to make the indentations,
  wherein (1) the reconditioning wafer further comprises an additional layer that covers at least an area of the carrier substrate that corresponds to the array of protrusions, and wherein the thickness of the additional layer is less than the height of the protrusions, so that the tip of the protrusions extends outwardly from the surface of the additional layer, or
  wherein (2) the planar surface of the carrier substrate comprises, in an area apart from the at least one array of protrusions, a layer formed of a material that is suitable to pick up debris from the support surface of the wafer holding stage.

22. The reconditioning wafer according to claim 21, comprising the additional layer that covers the at least an area of the carrier substrate that corresponds to the array of protrusions, and wherein the thickness of the additional layer is less than the height of the protrusions, so that the tip of the protrusions extends outwardly from the surface of the additional layer.

23. The reconditioning wafer according to claim 22, wherein the additional layer is formed of a material that is suitable to pick up debris from the support surface of the wafer holding stage.

24. The reconditioning wafer according to claim 21, wherein the planar surface of the carrier substrate comprises, in the area apart from the at least one array of protrusions, the layer formed of the material that is suitable to pick up debris from the support surface of the wafer holding stage.

* * * * *